United States Patent
Qian et al.

(10) Patent No.: US 10,923,597 B2
(45) Date of Patent: Feb. 16, 2021

(54) TRANSISTOR AND METHOD FOR MANUFACTURING THE SAME, DISPLAY SUBSTRATE, AND DISPLAY APPARATUS

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Haijiao Qian, Beijing (CN); Chengshao Yang, Beijing (CN); Yinhu Huang, Beijing (CN); Yunhai Wan, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/427,730

(22) Filed: May 31, 2019

(65) Prior Publication Data

US 2020/0135931 A1 Apr. 30, 2020

(30) Foreign Application Priority Data

Oct. 24, 2018 (CN) .......................... 201811243824.6

(51) Int. Cl.
*H01L 29/786* (2006.01)
*H01L 27/12* (2006.01)
(Continued)

(52) U.S. Cl.
CPC .... *H01L 29/78618* (2013.01); *H01L 27/1222* (2013.01); *H01L 27/1274* (2013.01);
(Continued)

(58) Field of Classification Search
CPC ............. H01L 27/1222; H01L 27/1274; H01L 29/458; H01L 29/66765; H01L 29/78609; H01L 29/78678; H01L 29/78618
See application file for complete search history.

(56) References Cited

U.S. PATENT DOCUMENTS 5,864,150 A * 1/1999 Lin ................... H01L 29/66765
257/61
2005/0218403 A1* 10/2005 Kuo .................. H01L 29/78678
257/59
(Continued)

*Primary Examiner* — Peniel M Gumedzoe
(74) *Attorney, Agent, or Firm* — Nath, Goldberg & Meyer; Joshua B. Goldberg

(57) ABSTRACT

A transistor and a method for manufacturing the same, a display substrate, and a display apparatus are provided. The transistor may include: a substrate; an active region on the substrate and including a polycrystalline silicon region; an etch stop layer at a side of the polycrystalline silicon region distal to the substrate; and a first heavily doped amorphous silicon region and a second heavily doped amorphous silicon region both at a side of the etch stop layer distal to the substrate; the polycrystalline silicon region having a first side surface corresponding to the first heavily doped amorphous silicon region and a second side surface corresponding to the second heavily doped amorphous silicon region; wherein an orthographic projection of the polycrystalline silicon region on a plane in which a lower surface of the etch stop layer lies does not go beyond the lower surface of the etch stop layer.

18 Claims, 5 Drawing Sheets

(51) Int. Cl.
*H01L 29/45* (2006.01)
*H01L 29/66* (2006.01)

(52) U.S. Cl.
CPC ...... *H01L 29/458* (2013.01); *H01L 29/66765* (2013.01); *H01L 29/78609* (2013.01); *H01L 29/78678* (2013.01)

(56) References Cited

U.S. PATENT DOCUMENTS

2009/0057672 A1* 3/2009 Kobayashi ........ H01L 29/78696
                                                                              257/59
2019/0259879 A1* 8/2019 He ................... H01L 29/78606

* cited by examiner

TRANSISTOR AND METHOD FOR MANUFACTURING THE SAME, DISPLAY SUBSTRATE, AND DISPLAY APPARATUS

CROSS-REFERENCE TO RELATED APPLICATIONS

The present application claims the priority of Chinese Patent Application No. 201811243824.6, filed on Oct. 24, 2018, the contents of which are incorporated herein in their entirety by reference.

TECHNICAL FIELD

The present disclosure relates to a transistor, a method for manufacturing the same, a display substrate, and a display apparatus.

BACKGROUND

A transistor is a solid semiconductor device, which has various functions such as wave detection, rectification, amplification switching, voltage stabilization, signal modulation, and the like. The transistor, serving as a variable current switch, is able to control output current based on input voltage.

SUMMARY

According to a first aspect of the present disclosure, the present disclosure provides a transistor, including: a substrate; an active region provided on the substrate and including a polycrystalline silicon region; an etch stop layer provided at a side of the polycrystalline silicon region distal to the substrate; and a first heavily doped amorphous silicon region and a second heavily doped amorphous silicon region, which are provided at a side of the etch stop layer distal to the substrate; the polycrystalline silicon region having a first side surface corresponding to the first heavily doped amorphous silicon region and a second side surface corresponding to the second heavily doped amorphous silicon region; an orthographic projection of the polycrystalline silicon region on a plane in which a lower surface of the etch stop layer is located does not go beyond the lower surface of the etch stop layer, and an orthographic projection, on the plane in which the lower surface of the etch stop layer is located, of at least one of the first side surface and the second side surface of the polycrystalline silicon region is within the lower surface of the etch stop layer.

In some embodiments, the orthographic projection of the polycrystalline silicon region on the plane, in which the lower surface of the etch stop layer is located, is entirely within the lower surface of the etch stop layer.

In some embodiments, the active region further includes a first amorphous silicon region and a second amorphous silicon region which are provided in the same layer as the polycrystalline silicon region, the first amorphous silicon region and the second amorphous silicon region are connected to the first side surface and the second side surface of the polycrystalline silicon region, respectively.

In some embodiments, the first heavily doped amorphous silicon region is provided at a side of the first amorphous silicon region distal to the substrate, and the second heavily doped amorphous silicon region is provided at a side of the second amorphous silicon region distal to the substrate.

In some embodiments, the transistor further includes a third amorphous silicon region provided at a side of the first amorphous silicon region distal to the substrate, and a fourth amorphous silicon region provided at a side of the second amorphous silicon region distal to the substrate.

In some embodiments, the first heavily doped amorphous silicon region is provided at a side of the third amorphous silicon region distal to the substrate, and the second heavily doped amorphous silicon region is provided at a side of the fourth amorphous silicon region distal to the substrate.

In some embodiments, the transistor further includes a gate provided on an upper surface of the substrate.

In some embodiments, the transistor further includes a gate insulation layer provided at a side of the gate distal to the substrate.

In some embodiments, the transistor further includes a first electrode provided at a side of the first heavily doped amorphous silicon region distal to the substrate, and a second electrode provided at a side of the second heavily doped amorphous silicon region distal to the substrate.

According to a second aspect of the present disclosure, the present disclosure provides a display substrate, including the transistor described above.

According to a third aspect of the present disclosure, the present disclosure provides a display apparatus, including the display substrate described above.

According to a fourth aspect of the present disclosure, the present disclosure provides a method for manufacturing a transistor, including: providing a substrate; forming a first amorphous silicon layer on the substrate, and converting a part of the first amorphous silicon layer into a polycrystalline silicon region; forming an etch stop layer on the first amorphous silicon layer by a patterning process; forming a first heavily doped amorphous silicon region and a second heavily doped amorphous silicon region on the etch stop layer, wherein the polycrystalline silicon region has a first side surface corresponding to the first heavily doped amorphous silicon region and a second side surface corresponding to the second heavily doped amorphous silicon region; wherein an orthographic projection of the polycrystalline silicon region on a plane in which a lower surface of the etch stop layer is located does not go beyond the lower surface of the etch stop layer, and an orthographic projection, on the plane in which the lower surface of the etch stop layer is located, of at least one of the first side surface and the second side surface of the polycrystalline silicon region is within the lower surface of the etch stop layer.

In some embodiments, the orthographic projection of the polycrystalline silicon region on the plane in which the lower surface of the etch stop layer is located is within the lower surface of the etch stop layer.

In some embodiments, the forming the first amorphous silicon layer on the substrate further includes:

forming a first amorphous silicon region and a second amorphous silicon region, wherein the first amorphous silicon region and the second amorphous silicon region are connected to the first side surface and the second side surface of the polycrystalline silicon region, respectively.

In some embodiments, the manufacturing method further includes: forming a gate on an upper surface of the substrate by a patterning process.

In some embodiments, the manufacturing method further includes: forming a third amorphous silicon region and a fourth amorphous silicon region on the first amorphous silicon region and the second amorphous silicon region, respectively.

In some embodiments, forming the first heavily doped amorphous silicon region and the second heavily doped amorphous silicon region on the etch stop layer includes:

depositing a heavily doped second amorphous silicon layer on the etch stop layer, wherein the second amorphous silicon layer is used for forming the first heavily doped amorphous silicon region and the second heavily doped amorphous silicon region.

In some embodiments, after forming the second amorphous silicon layer, the manufacturing method further includes: forming a conduction layer on the second amorphous silicon layer, wherein the conduction layer is used for forming a first electrode and a second electrode.

In some embodiments, after forming the conduction layer, the manufacturing method further includes: etching the conduction layer and the second amorphous silicon by using one photolithography process to form the first electrode and the second electrode, and the first heavily doped amorphous silicon region and the second heavily doped amorphous silicon region.

In some embodiments, forming the first amorphous silicon region and the second amorphous silicon region includes: etching the first amorphous silicon layer by using one photolithography process to form the first amorphous silicon region and the second amorphous silicon region.

DETAILED DESCRIPTION

In order to allow a person skilled in the art to better understand technical solutions of the present disclosure, the present disclosure will be described in further detail below in conjunction with the accompanying drawings and specific implementations.

In the present disclosure, if two structures are said to be "provided in a same layer", it means that they are formed of the same material layer, thus they are positioned in the same layer in a sense of layered relationship, but it does not represent that they are of the same distance away from a substrate, nor that other layer structures between the two structures and the substrate are exactly the same.

In the present disclosure, "patterning process" refers to a step for forming a structure having a particular pattern, and may be a photolithography process including one or more of steps of forming a material layer, coating photoresist, exposing, developing, etching, removing photoresist and so on. Obviously, the "patterning process" may also be other process such as imprint process, inkjet printing process, or the like.

In the present disclosure, if a projection of structure A is said to be within structure B, it means that the projection of structure A is located in the structure B and has a certain distance from a boundary of the structure B, excluding the situation in which the projection is located at the boundary of the structure B.

Figure 1:
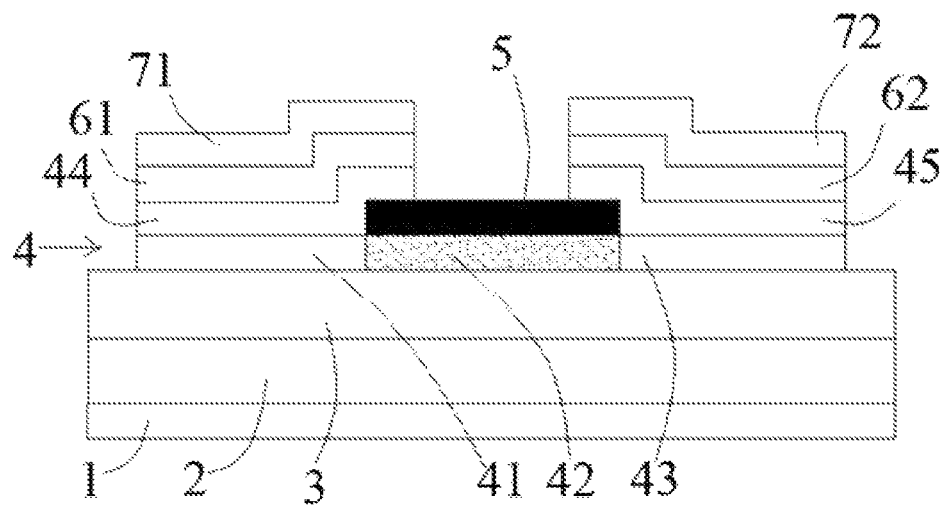
FIG. 1 is a schematic diagram of a structure of a transistor in a display substrate of the related art.

FIG. 1 illustrates a structure of a silicon-based bottom gate ESL transistor in a display substrate of the related art. In such a transistor, on a substrate 1, there are a gate 2, a gate insulation layer 3 and an active region 4 from bottom to top. The active region 4 is divided into three parts; a first amorphous silicon region 41, a polycrystalline silicon region 42, and a second amorphous silicon region 43. These three parts are initially all made of amorphous silicon material, and a part of the amorphous silicon material may be converted into polycrystalline silicon material by laser irradiation, so as to form the above polycrystalline silicon region 42. Converting the part of the amorphous silicon material into polycrystalline silicon material is to improve mobility of carriers in the active region 4.

In the related art, an etch stop layer (ESL) 5 may be additionally provided on the polycrystalline silicon region 42, and generally, a boundary of the etch stop layer 5 is aligned with a boundary of the polycrystalline silicon region 42, so as to achieve protection of the polycrystalline silicon region 42. The transistor further includes a first electrode 71 and a first heavily doped amorphous silicon region 61 for forming Ohmic contact with the first electrode 71, a second electrode 72 and a second heavily doped amorphous silicon region 62 for forming Ohmic contact with the second electrode 72. In order to reduce leakage current between both the first and second heavily doped amorphous silicon regions 61 and 62 and the polycrystalline silicon region 42, a conventional method is to additionally provide a third amorphous silicon region 44 between the first heavily doped amorphous silicon region 61 and the first amorphous silicon region 41, and a fourth amorphous silicon region 45 between the second heavily doped amorphous silicon region 62 and the second amorphous silicon region 43, so as to increase distances between both the first and second heavily doped amorphous silicon regions 61 and 62 and the polycrystalline silicon region 42.

The present disclosure provides a new structure to reduce leakage current of the above type of transistor.

Figure 2:
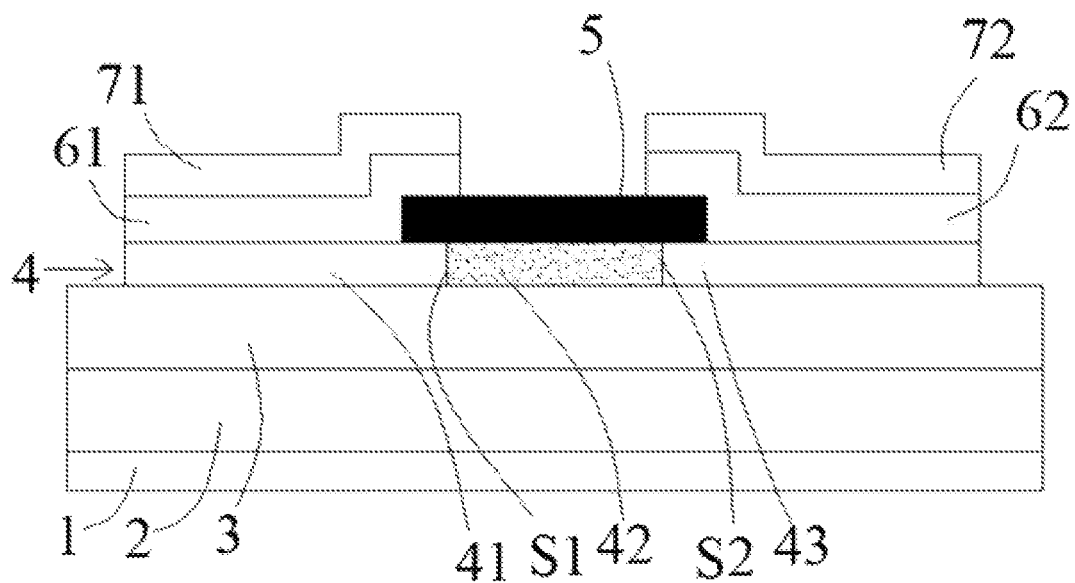
FIG. 2 is a schematic diagram of a structure of a transistor according to some embodiments of the present disclosure.

Some embodiments of the present disclosure provide a transistor, as shown in FIG. 2, the transistor may include: a substrate 1; an active region 4 provided on the substrate and including a polycrystalline silicon region 42; an etch stop layer 5 provided at a side of the polycrystalline silicon region 42 distal to the substrate; a first heavily doped amorphous silicon region 61 and a second heavily doped amorphous silicon region 62 both provided at a side of the etch stop layer 5 distal to the substrate; the polycrystalline silicon region 42 has a first side surface S1 corresponding to the first heavily doped amorphous silicon region 61 and a second side surface S2 corresponding to the second heavily doped amorphous silicon region 62; wherein an orthographic projection of the polycrystalline silicon region 42 on a plane in which a lower surface of the etch stop layer 5 lies does not go beyond the lower surface of the etch stop layer 5, and an orthographic projection, on the plane in which the lower surface of the etch stop layer 5 lies, of at least one of the first side surface S1 and the second side surface S2 of the polycrystalline silicon region 42 is within the lower surface of the etch stop layer 5.

In some embodiments of the present disclosure, the orthographic projection on the plane in which the lower surface of the etch stop layer lies of at least one of the first side surface and the second side surface of the polycrystalline silicon region is located within the lower surface of the etch stop layer, so that the distance from the polycrystalline silicon region 42 to at least one of the first and second heavily doped amorphous silicon regions 61 and 62 is increased, thereby reducing the leakage current between at least one of the first and second heavily doped amorphous silicon regions 61 and 62 and the polycrystalline silicon region 42.

Some embodiments of the present disclosure provide a transistor, which may include: a substrate 1; a gate 2 provided on the substrate 1; a gate insulation layer 3 provided at a side of the gate 2 distal to the substrate 1; an active region 4 provided at a side of the gate insulation layer 3 distal to the substrate 1 and including a polycrystalline silicon region 42, a first amorphous silicon region 41, and a second amorphous silicon region 43 provided in a same layer; and an etch stop layer 5 provided at a side of the polycrystalline silicon region 42 distal to the substrate 1. The first amorphous silicon region 41 and the second amorphous silicon region 43 are connected to the first side surface S and the second side surface S2, which are opposite to each other, of the polycrystalline silicon region 42, respectively, for example, the first amorphous silicon region 41 is connected to the first side surface S1 of the polycrystalline silicon region 42, and the second amorphous silicon region 43 is connected to the second side surface S2 of the polycrystalline silicon region 42. An orthographic projection of the polycrystalline silicon region 42 on a plane in which a lower surface of the etch stop layer 5 lies does not go beyond the lower surface of the etch stop layer 5, and an orthographic projection, on the plane in which the lower surface of the etch stop layer 5 lies, of at least one of the first side surface S and the second side surface S2 of the polycrystalline silicon region 42 is located within the lower surface of the etch stop layer 5.

The etch stop layer 5 is formed of, for example, silicon oxide. The orthographic projection of the polycrystalline silicon region 42 on a plane in which the lower surface of the etch stop layer 5 lies does not go beyond the lower surface of the etch stop layer 5, for example, each side surface of the polycrystalline silicon region 42 is either aligned with the etch stop layer 5 in a direction perpendicular to the substrate, or located within the boundary of the lower surface of the etch stop layer 5.

The orthographic projection, on the plane in which the lower surface of the etch stop layer 5 lies, of at least one of the first side surface S1 and the second side surface S2 of the polycrystalline silicon region 42 is located within the lower surface of the etch stop layer 5, for example, the orthographic projection, on the plane in which the lower surface of the etch stop layer 5 lies, of at least one of the first side surface S1 and the second side surface S2 of the polycrystalline silicon region 42 is located within the boundary of the lower surface of the etch stop layer 5, and has a certain distance from the corresponding boundary of the etch stop layer 5. At least one of an interface between the polycrystalline silicon region 42 and the first amorphous silicon region 41 (for example, the first side surface S1) and an interface between the polycrystalline silicon region 42 and the second amorphous silicon region 43 (for example, the second side surface S2) is provided at a position corresponding to the inside of the etch stop layer 5, for example, the orthographic projection of the first side surface S1 of the polycrystalline silicon region 42 on the plane in which the lower surface of the etch stop layer 5 lies is located within the lower surface of the etch stop layer 5, and the orthographic projection of the second side surface S2 of the polycrystalline silicon region 42 on the plane in which the lower surface of the etch stop layer 5 lies coincide with the corresponding boundary of the lower surface of the etch stop layer 5.

The boundary of the etch stop layer 5 corresponds in position to a boundary of the first heavily doped amorphous silicon region 61 and a boundary of the second heavily doped amorphous silicon region 62. The distance from the polycrystalline silicon region 42 to at least one of the first heavily doped amorphous silicon region 61 and the second heavily doped amorphous silicon region 62 is increased, which is advantageous to reducing leakage current from the first heavily doped amorphous silicon region 61 to the second heavily doped amorphous silicon region 62 via the polycrystalline silicon region 42.

In an embodiment, the orthographic projection of the polycrystalline silicon region 42 on the plane in which the lower surface of the etch stop layer 5 lies, is entirely located within the lower surface of the etch stop layer 5.

That is, the etch stop layer 5 completely covers the polycrystalline silicon region 42, at the viewing angle of FIG. 2, side surfaces of the etch stop layer 5 all extend beyond corresponding side surfaces of the polycrystalline silicon region 42 in four directions of pointing outward perpendicular to paper, inward perpendicular to paper, left and right. In the embodiment, the polycrystalline silicon region 42 is completely covered by the etch stop layer 5, so that distances from the polycrystalline silicon region 42 to both of the first and second heavily doped amorphous silicon regions 61 and 62 are increased, thereby reducing the leakage current from the first heavily doped amorphous silicon region 61 to the second heavily doped amorphous silicon region 62 via the polycrystalline silicon region 42.

In an embodiment, referring to FIG. 2, in some embodiments, the transistor may further include a first heavily doped amorphous silicon region 61 provided at a side of the first amorphous silicon region 41 distal to the substrate 1, and a second heavily doped amorphous silicon region 62 provided at a side of the second amorphous silicon region 43 distal to the substrate 1.

For example, the first heavily doped amorphous silicon region 61 is provided directly on the first amorphous silicon region 41, and the second heavily doped amorphous silicon region 62 is provided directly on the second amorphous silicon region 43. Parts of the first heavily doped amorphous silicon region 61 and the second heavily doped amorphous silicon region 62 are provided in the same layer as the etch stop layer 5, and other parts of the first heavily doped amorphous silicon region 61 and the second heavily doped amorphous silicon region 62 extend to an upper surface of the etch stop layer 5 and partly overlap with the upper surface of the etch stop layer 5.

Because the orthographic projection of the polycrystalline silicon region 42 on the plane in which the lower surface of the etch stop layer lies is entirely located within the lower surface of the etch stop layer, the third amorphous silicon region 44 and the fourth amorphous silicon region 45 of the related art can be omitted, which, obviously, omits related process steps. As such, not only the structure of the transistor but also the manufacturing method of the transistor are simplified.

In an embodiment, the transistor also includes a first electrode 71 provided at a side of the first heavily doped amorphous silicon region 61 distal to the substrate 1, and a second electrode 72 provided at a side of the second heavily doped amorphous silicon region 62 distal to the substrate 1.

The first electrode 71 forms Ohmic contact with the first heavily doped amorphous silicon region 61, and the second electrode 72 forms Ohmic contact with the second heavily doped amorphous silicon region 62. The first electrode 71 and the second electrode 72 form a source and a drain of the transistor, respectively.

Figure 7:
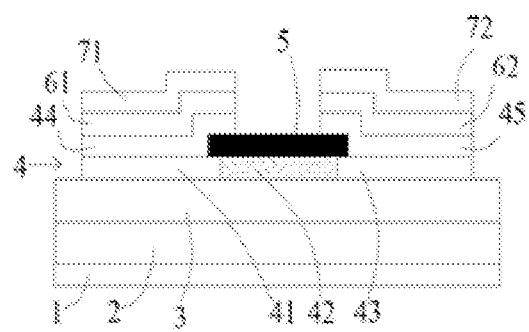
FIG. 7 is a schematic diagram of a structure of a transistor according to some embodiments of the present disclosure.

It is to be noted that, in other embodiments of the present disclosure, the transistor may also include a third amorphous silicon region and a fourth amorphous silicon region, for example, the third amorphous silicon region and the fourth amorphous silicon region may be provided at a side, distal to the substrate, of the etch stop layer 5 shown in FIGS. 2 and 7 and the first heavily doped amorphous silicon region 61 and the second heavily doped amorphous silicon region 62 may be provided correspondingly at sides of the third amorphous silicon region 44 and the fourth amorphous silicon region 45 distal to the substrate, respectively. With the third amorphous silicon region 44 and the fourth amorphous silicon region 45, and the etch stop layer 5 shown in FIGS. 2 and 7, the leakage current from the first heavily doped amorphous silicon region 61 to the second heavily doped amorphous silicon region 62 via the polycrystalline silicon region 42 is further reduced.

In some embodiments of the present disclosure, the orthographic projection of the polycrystalline silicon region on the plane in which the lower surface of the etch stop layer lies is completely located within the lower surface of the etch stop layer, distances of the polycrystalline silicon region 42 from both of the first and second heavily doped amorphous silicon regions 61 and 62 are increased, thereby reducing the leakage current from the first heavily doped amorphous silicon region 61 to the second heavily doped amorphous silicon region 62 via the polycrystalline silicon region 42.

Figure 3:
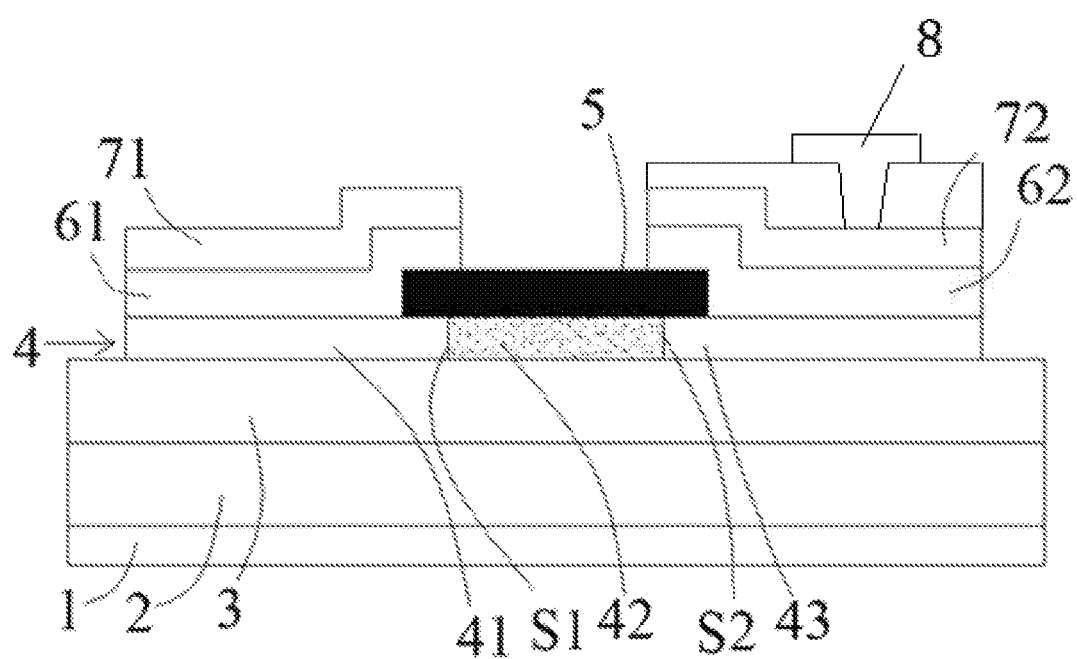
FIG. 3 is a schematic diagram of a structure of a display substrate according to some embodiments of the present disclosure.

Some embodiments of the present disclosure provide a display substrate, as shown in FIG. 3, the display substrate may include a transistor of an embodiment of the present disclosure shown in FIG. 2, and a pixel electrode 8 coupled to the second electrode 72 (for example, a drain) of the transistor.

In the display substrate of some embodiments of the present disclosure, by applying the transistor of the embodiment shown in FIG. 2 to the display substrate, the distance between the polycrystalline silicon region 42 and at least one of the first and second heavily doped amorphous silicon regions 61 and 62 can be increased, thereby reducing the leakage current from the first heavily doped amorphous silicon region 61 to the second heavily doped amorphous silicon region 62 via the polycrystalline silicon region 42.

Figure 4:
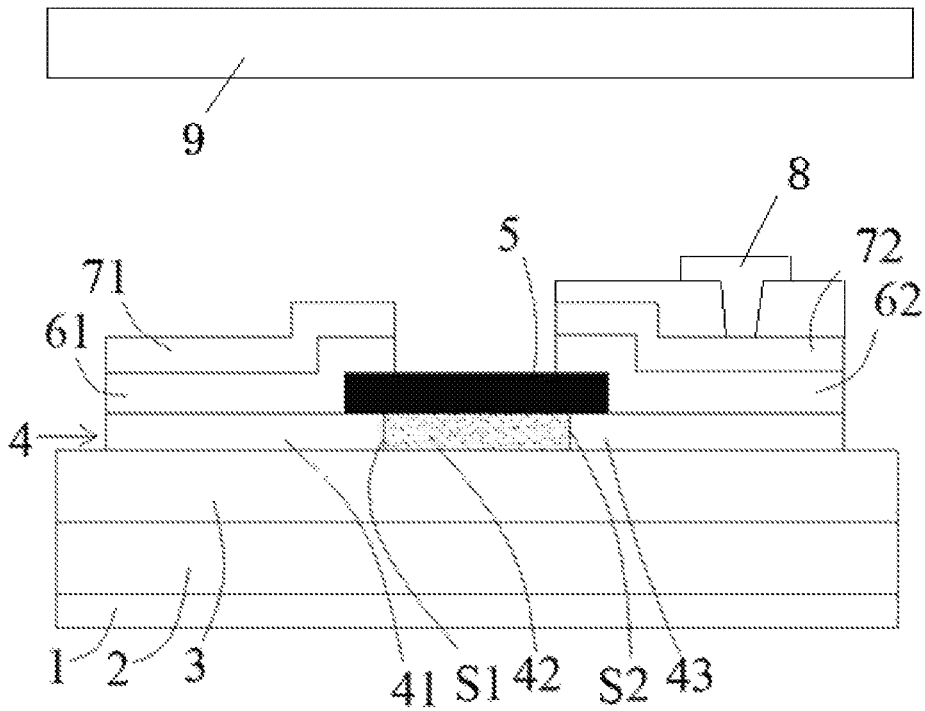
FIG. 4 is a schematic diagram of a structure of a display apparatus according to some embodiments of the present disclosure.

Some embodiments of the present disclosure provide a display apparatus, as shown in FIG. 4, the display apparatus may include the display substrate according to the above embodiment of the present disclosure, and a counter substrate 9 provided opposite to the display substrate.

For example, the display apparatus may be any product or component having a display function such as a liquid crystal display panel, an organic light emitting diode (OLED) display panel, an electronic paper, a mobile phone, a tablet PC, a television, a monitor, a notebook, a digital photo frame, a navigator and the like.

In the display apparatus of some embodiments of the present disclosure, by applying the display substrate of the above embodiment of the display apparatus, the distance from the polycrystalline silicon region 42 to at least one of the first and second heavily doped amorphous silicon regions 61 and 62 can be increased, thereby reducing the leakage current from the first heavily doped amorphous silicon region 61 to the second heavily doped amorphous silicon region 62 via the polycrystalline silicon region 42.

Figure 5:
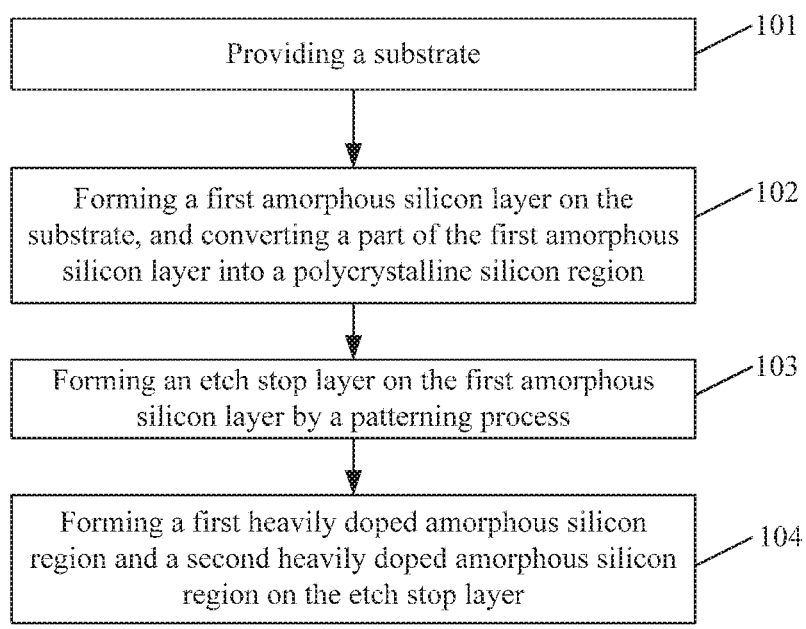
FIG. 5 is a flow chart of a method for manufacturing a transistor according to some embodiments of the present disclosure.

Some embodiments of the present disclosure provide a method for manufacturing a transistor, as shown in FIG. 5, and the method for manufacturing the transistor may include steps 101 to 104.

Step 101 includes: providing a substrate.

Step 102 includes: forming a first amorphous silicon layer on the substrate, and converting a part of the first amorphous silicon layer into a polycrystalline silicon region.

Step 103 includes: forming an etch stop layer on the first amorphous silicon layer by a patterning process.

Step 104 includes: forming a first heavily doped amorphous silicon region and a second heavily doped amorphous silicon region on the etch stop layer, the polycrystalline silicon region having a first side surface corresponding to the first heavily doped amorphous silicon region and a second side surface corresponding to the second heavily doped amorphous silicon region.

For example, an orthographic projection of the polycrystalline silicon region on a plane in which a lower surface of the etch stop layer lies does not go beyond the lower surface of the etch stop layer, and an orthographic projection, on the plane in which the lower surface of the etch stop layer lies, of at least one of the first side surface and the second side surface of the polycrystalline silicon region is located within the lower surface of the etch stop layer.

Figure 6:
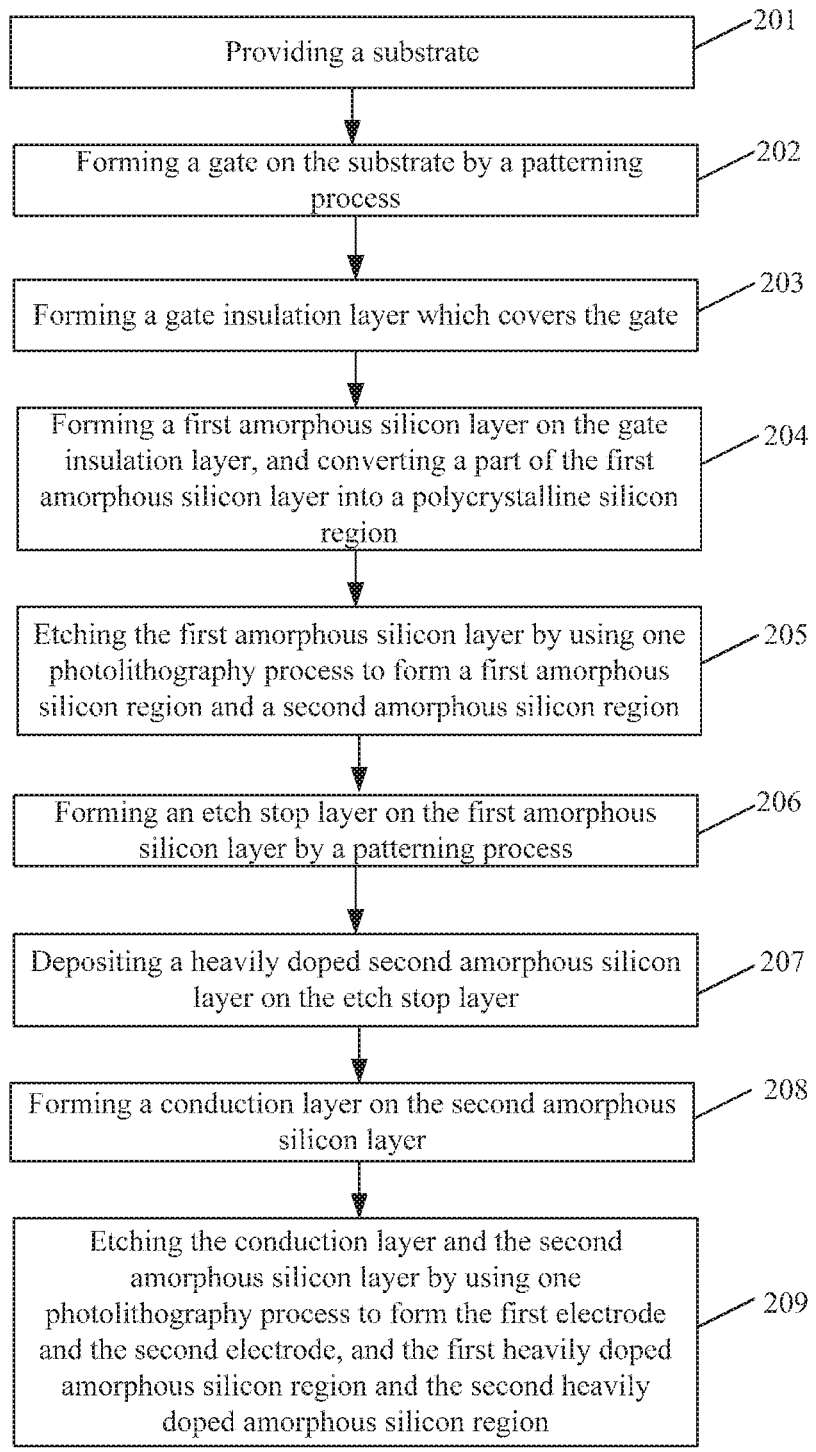
FIG. 6 is a flow chart of another method for manufacturing a transistor according to some embodiments of the present disclosure.

Some embodiments of the present disclosure provide a method for manufacturing a transistor, as shown in FIG. 6, and the method for manufacturing the transistor may include steps 201 to 209.

Step 201 includes: providing a substrate 1.

Step 202 includes: forming a gate 2 on the substrate 1 by a patterning process.

Step 203 includes: forming a gate insulation layer 3 which covers the gate 2. In an embodiment, the gate insulation layer 3 is formed by employing, for example, chemical vapor deposition process.

Step 204 includes: forming a first amorphous silicon layer on the gate insulation layer 3, and converting a part of the first amorphous silicon layer into a polycrystalline silicon region 42, wherein the first amorphous silicon layer is also used for forming a first amorphous silicon region 41 and a second amorphous silicon region 43.

For example, after forming the first amorphous silicon layer by employing a process such as chemical vapor deposition, the first amorphous silicon layer needs to undergo dehydrogenation treatment (to take out hydrogen therefrom) and be washed using ozone, hydrofluoric acid or the like.

For example, the polycrystalline silicon region 42 is formed by laser irradiation (e.g., by employing micro laser array technique, which is also called MLA technique, micro lens array technique). Amorphous silicon material melts under laser irradiation, and then recrystallizes, so that the amorphous silicon is converted into polycrystalline silicon. Since hydrogen in the first amorphous silicon is removed, in the process of this conversion, a problem that heated hydrogen breaks away from the first amorphous silicon layer to cause spatter will not arise.

Step 205 includes: etching the first amorphous silicon layer by using one photolithography process to form a first amorphous silicon region 41 and a second amorphous silicon region 43.

Step 206 includes: forming an etch stop layer 5 on the first amorphous silicon layer by a patterning process.

For example, an orthographic projection, on the plane in which the lower surface of the etch stop layer lies, of at least one of the first side surface and the second side surface of the polycrystalline silicon region is located inside the lower surface of the etch stop layer.

In some embodiments, the transistor may also include a third amorphous silicon region and a fourth amorphous silicon region. In this case, the method for manufacturing the transistor may also include: after forming the etch stop layer, forming the third amorphous silicon region and the fourth amorphous silicon region on the first amorphous silicon region and the second amorphous silicon region, respectively.

Step 207 includes: depositing a second amorphous silicon layer, which is heavily doped, on the etch stop layer 5, the second amorphous silicon layer is used for forming a first heavily doped amorphous silicon region 61 and a second heavily doped amorphous silicon region 62.

Step 208 includes: forming a conduction layer on the second amorphous silicon layer, wherein the conduction layer is used for forming a first electrode 71 and a second electrode 72.

Step 209 includes: etching the conduction layer and the second amorphous silicon layer by using one photolithography process to form the first electrode 71 and the second electrode 72, and the first heavily doped amorphous silicon region 61 and the second heavily doped amorphous silicon region 62.

It is to be noted that, the step of etching the second amorphous silicon layer and the conduction layer using a photolithography process to form the first heavily doped amorphous silicon region 61 and the second heavily doped amorphous silicon region 62, and the first electrode 71 and the second electrode 72, may also be performed separately for the second amorphous silicon layer and the conduction layer. For example, in step 207, the second amorphous silicon layer may be etched using a photolithography process to form the first heavily doped amorphous silicon region 61 and the second heavily doped amorphous silicon region 62.

The method for manufacturing the transistor of the embodiment of the present disclosure may be a method for manufacturing the transistor of the above embodiment shown in FIG. 2, in other embodiments of the present disclosure, other processes may be employed to form the transistor of the above embodiment shown in FIG. 2. One may refer to the above embodiments for specific features and technical effects of every structure, which are not repeated herein.

It should be understood that, the above embodiments are only exemplary embodiments for the purpose of explaining the principle of the present disclosure, and the present disclosure is not limited thereto. For one of ordinary skill in the art, various improvements and modifications may be made without departing from the spirit and essence of the present disclosure. These improvements and modifications also fall within the protection scope of the present disclosure.

What is claimed is:

1. A transistor, comprising:
    a substrate;
    an active region provided on the substrate and comprising a polycrystalline silicon region;
    an etch stop layer provided at a side of the polycrystalline silicon region distal to the substrate; and
    a first heavily doped amorphous silicon region and a second heavily doped amorphous silicon region both provided at a side of the etch stop layer distal to the substrate;
    wherein the polycrystalline silicon region has a first side surface corresponding to the first heavily doped amorphous silicon region and a second side surface corresponding to the second heavily doped amorphous silicon region; and
    an orthographic projection of the polycrystalline silicon region on a plane in which a lower surface of the etch stop layer lies does not go beyond the lower surface of the etch stop layer, and an orthographic projection, on the plane in which the lower surface of the etch stop layer lies, of at least one of the first side surface and the second side surface of the polycrystalline silicon region is located within the lower surface of the etch stop layer;
    wherein the active region further comprises a first amorphous silicon region and a second amorphous silicon region which are provided in the same layer as the polycrystalline silicon region, and the first amorphous silicon region and the second amorphous silicon region are connected to the first side surface and the second side surface of the polycrystalline silicon region, respectively;
    wherein the transistor further comprises a third amorphous silicon region provided at a side of the first amorphous silicon region distal to the substrate, and a fourth amorphous silicon region provided at a side of the second amorphous silicon region distal to the substrate; and
    wherein the first heavily doped amorphous silicon region is layered on a top surface of the third amorphous silicon region.

2. The transistor according to claim 1, wherein the orthographic projection of the polycrystalline silicon region on the plane in which the lower surface of the etch stop layer lies is entirely located within the lower surface of the etch stop layer.

3. The transistor according to claim 1, wherein the first heavily doped amorphous silicon region is provided at a side of the first amorphous silicon region distal to the substrate, and the second heavily doped amorphous silicon region is provided at a side of the second amorphous silicon region distal to the substrate.

4. The transistor according to claim 1, wherein the first heavily doped amorphous silicon region is provided at a side of the third amorphous silicon region distal to the substrate, and the second heavily doped amorphous silicon region is provided at a side of the fourth amorphous silicon region distal to the substrate.

5. The transistor according to claim 1, further comprising a gate provided on an upper surface of the substrate.

6. The transistor according to claim 5, further comprising a gate insulation layer provided at a side of the gate distal to the substrate.

7. The transistor according to claim 1, further comprising a first electrode provided at a side of the first heavily doped amorphous silicon region distal to the substrate, and a second electrode provided at a side of the second heavily doped amorphous silicon region distal to the substrate.

8. A display substrate, comprising the transistor according to claim 1 and a pixel electrode coupled to the transistor.

9. A display apparatus, comprising the display substrate according to claim 8 and a counter substrate provided opposite to the display substrate and bonded to the display substrate.

10. The transistor according to claim 1, wherein the second heavily doped amorphous silicon layer is layered on a top surface of the fourth amorphous silicon region.

11. A method for manufacturing a transistor, comprising:
providing a substrate;
forming a first amorphous silicon layer on the substrate, and converting a part of the first amorphous silicon layer into a polycrystalline silicon region;
forming an etch stop layer on the first amorphous silicon layer by a patterning process; and
forming a first heavily doped amorphous silicon region and a second heavily doped amorphous silicon region on the etch stop layer, the polycrystalline silicon region having a first side surface corresponding to the first heavily doped amorphous silicon region and a second side surface corresponding to the second heavily doped amorphous silicon region;
wherein an orthographic projection of the polycrystalline silicon region on a plane in which a lower surface of the etch stop layer lies does not go beyond the lower surface of the etch stop layer, and an orthographic projection, on the plane in which the lower surface of the etch stop layer lies, of at least one of the first side surface and the second side surface of the polycrystalline silicon region is located within the lower surface of the etch stop layer;
wherein the forming the first amorphous silicon layer on the substrate comprises:
forming a first amorphous silicon region and a second amorphous silicon region, wherein the first amorphous silicon region and the second amorphous silicon region are connected to the first side surface and the second side surface of the polycrystalline silicon region, respectively;
wherein the method further comprises forming a third amorphous silicon region and a fourth amorphous silicon region on the first amorphous silicon region and the second amorphous silicon region, respectively; and
wherein the first heavily doped amorphous silicon region is layered on a top surface of the third amorphous silicon region.

12. The method according to claim 11, wherein the orthographic projection of the polycrystalline silicon region on the plane in which the lower surface of the etch stop layer lies is located within the lower surface of the etch stop layer.

13. The method according to claim 11, further comprising: forming a gate on an upper surface of the substrate by a patterning process.

14. The method according to claim 11, wherein forming the first heavily doped amorphous silicon region and the second heavily doped amorphous silicon region on the etch stop layer comprises:
depositing a heavily doped second amorphous silicon layer on the etch stop layer, wherein the second amorphous silicon layer is used for forming the first heavily doped amorphous silicon region and the second heavily doped amorphous silicon region.

15. The method according to claim 14, after forming the second amorphous silicon layer, further comprising:
forming a conduction layer on the second amorphous silicon layer, wherein the conduction layer is used for forming a first electrode and a second electrode.

16. The method according to claim 15, after forming the conduction layer, further comprising:
etching the conduction layer and the second amorphous silicon layer by using one photolithography process to form the first electrode and the second electrode, and the first heavily doped amorphous silicon region and the second heavily doped amorphous silicon region.

17. The method according to claim 11, wherein forming the first amorphous silicon region and the second amorphous silicon region comprises:
etching the first amorphous silicon layer by using one photolithography process to form the first amorphous silicon region and the second amorphous silicon region.

18. The method according to claim 11, wherein the second heavily doped amorphous silicon layer is layered on a top surface of the fourth amorphous silicon region.

* * * * *